(12) United States Patent
Segal et al.

(10) Patent No.: US 8,480,826 B2
(45) Date of Patent: Jul. 9, 2013

(54) SPECULAR COATINGS FOR COMPOSITE STRUCTURES

(75) Inventors: Kenneth N. Segal, Ellicott City, MD (US); James M. Lohr, Ellicott City, MD (US); Russell Rowles, Newark, DE (US); Wanda Peters, Springdale, MD (US); Robert Kiwak, Baltimore, MD (US)

(73) Assignee: The United States of America as represented by the Administrator of the National Aeronautics Space Administration, Washington, DC (US)

(*) Notice: Subject to any disclaimer, the term of this patent is extended or adjusted under 35 U.S.C. 154(b) by 1847 days.

(21) Appl. No.: 11/736,874

(22) Filed: Apr. 18, 2007

(65) Prior Publication Data

US 2012/0193015 A1     Aug. 2, 2012

(51) Int. Cl.
    B29C 65/00    (2006.01)
    B32B 37/00    (2006.01)
(52) U.S. Cl.
    USPC .................... 156/64; 156/285; 156/306.6
(58) Field of Classification Search
    USPC ............... 156/285, 286, 306.6, 306.9, 307.1, 156/327.7, 64, 307.7, 378; 73/799, 802, 827, 73/830
    See application file for complete search history.

(56) References Cited

U.S. PATENT DOCUMENTS

| 4,629,527 A * | 12/1986 | Livi et al. ...................... 156/285 |
| 4,893,513 A * | 1/1990 | Schroeder et al. ............. 73/827 |
| 5,006,179 A * | 4/1991 | Gaddy ........................... 136/244 |
| 5,476,633 A * | 12/1995 | Sokolowski et al. ........... 419/57 |
| 6,284,385 B1 * | 9/2001 | Guillaumon et al. ......... 428/450 |
| 6,366,259 B1 * | 4/2002 | Pruett et al. .................... 343/853 |
| 6,634,236 B2 * | 10/2003 | Mars .............................. 73/799 |
| 2004/0045595 A1 * | 3/2004 | Makita et al. ................. 136/244 |
| 2007/0028661 A1 * | 2/2007 | Girshovich et al. ............ 73/1.01 |

OTHER PUBLICATIONS

"Plastic Thermal Expansion Coefficients" from archive.org taken from engineershandbook.com Mar. 17, 2006.*
"Table B.6 Room-Temperature Linear Coefficient of Thermal Expansion Values for Various Engineering Materials" from stormcable.com date unknown.*
Print out of "http://www.stormcable.com/uploads/thermal_expansion_date_table_tb06.pdf" taken from archive.org taken from stormcable.com displaying the pdf of "Table B.6 Room-Temperature Linear Coefficient of Thermal Expansion Values for Various Engineering Materials" was available on stormcable.com as of Jan. 14, 2005.*
"RTV566" from General Electric date unknown.*

* cited by examiner

*Primary Examiner* — John Goff

(57) ABSTRACT

Disclosed herein is a method for bonding dissimilar materials using an elastic adhesive to permit the bond to withstand variations in temperature and pressure. The use of elastic adhesive accommodates previous problems associated with large differences in thermal expansion coefficient between dissimilar materials, and provides a thermally and chemically stable materials combination that withstands large thermal shock loads, such as may be experienced in a space environment. Also disclosed herein is a method for attaching a coating to a structure. In particular applications, the coating may be (1) specular (greater than 98% specularity); or (2) RF reflective for use in applications including but not limited to high frequency satellite communications.

9 Claims, 3 Drawing Sheets

SPECULAR COATINGS FOR COMPOSITE STRUCTURES

The invention described herein was made by employees of the United States Government, and may be manufactured and used by or for the United States Government for governmental purposes without payment of any royalties thereon or therefor.

FIELD OF INVENTION

This invention relates generally to a method of bonding dissimilar materials and more particularly to a method for bonding dissimilar materials to withstand wide thermal variations and/or a low ambient pressure environment, such as that found in space. The invention further relates to a method for applying a coating, which may be specular or RF reflective or a plurality of solar cells, to a structure with dissimilar material properties.

BACKGROUND OF THE INVENTION

Generally, there is a need for methods to bond dissimilar materials. There is a great need for such methods in applications where the bonded dissimilar materials will be subjected to thermal or pressure variations, low pressure/vacuum, or other stresses that tend to separate the bonded materials.

As an example, each of the three major Earth Observing Satellite (EOS) observatories (Terra, Aqua, and Aura) has passively cooled cryogenic instruments (e.g. MODIS, AIRS, and TES) with radiators that point to deep space. These radiators must be shielded from Earth's albedo with a shade panel extending 1-2 m from the radiator beyond the penumbra of the spacecraft from the Earth as well as the sun. The outside of the shade is coated with a low absorptance, high emittance white paint to prevent the shade from getting too hot. The inside surface of the shade must have low absorptance and low emittance as well as high specularity to prevent the solar radiation that comes over the top of the spacecraft from reflecting back onto the radiator surface. As the spacecraft orbits Earth, it passes in and out of the Earth's shadow and experiences wide swings in the external thermal environment. The coatings inside and outside the shade must maintain their properties over this range of temperature.

Mass constraints for these missions have driven the use of low mass, high stiffness composite sandwich panels in place of the more traditional aluminum panels. These composite materials may be composed of multiple plies of either fiberglass or carbon fibers in an epoxy matrix sandwiched with honeycomb that results in a very low thermal expansion. Coating processes and materials that were previously successful with high thermal expansion aluminum panels do not work well with the newer low expansion composite structures.

In the space environment, earth orbiting satellites may be exposed to substantial temperature variations as they traverse their orbits, spending a portion of their orbit in direct sunlight and a portion of their orbit shielded from the sun by the earth. To maintain acceptable thermal control under such conditions, satellites are often coated with specular coatings that provide desirable properties of absorbance and emittance when properly bonded to a spacecraft structure to maintain spacecraft components within acceptable temperature ranges. It may also be desirable to bond RF reflective coatings to spacecraft structures to create a light weight antenna for communications. There thus is a need for methods to apply or bond such specular or RF coatings to spacecraft structures, where the coatings have dissimilar material properties, such as thermal coefficients of expansion, from the structures. Conventional methods exist for bonding materials, but such conventional methods do not reliably maintain attachment between dissimilar materials when exposed to substantial thermal or pressure variations, low pressure/vacuum or other stresses that tend to separate the bonded materials.

Specular surfaces have been used for thermal control on spacecraft for many years. One method of creating a specular coating is coating the outer aluminum surface with lacquer to make it smooth and then vapor depositing aluminum onto the lacquer surface to make it shiny/specular. Lacquer also has a high thermal coefficient of expansion that works well with aluminum. However, tests to demonstrate this on carbon fiber composite panels have shown that the high differential thermal coefficients of expansion between the lacquer and the composite panel showed cracks in the lacquer that increased in number and depth with thermal cycling to the point of breaking apart the fibers in the first ply of the composite face sheet.

Another method is to deposit the aluminum directly onto the face sheet. The face sheets are laid down on glass and consequently have a very specular surface, although the morphology of the top ply of fibers shows through and is easily detectable with optical measurements. This can be acceptable where the specularity requirement is less than 90%, but may not be suitable when higher specularity is required. However, when applied to carbon fiber face sheets, the aluminum film can be destroyed by galvanic corrosion between aluminum and small areas of exposed carbon fiber.

Yet another alternative for achieving a specular surface on a carbon fiber composite face sheet is a reverse coating or replication process. First a mold release film is applied to a tool plate, such as glass, followed by vapor depositing a coating of aluminum. Epoxy then is applied to the aluminized surface followed by the composite panel. After curing the composite panel, the tool is pulled away from the coated panel. This method is not easily repeatable and can be very expensive. In testing this method, sometimes all or part of the aluminum stuck to the glass of the tool plate, leaving blank spots on the panel. In order to achieve the required specularity, the epoxy was applied in a thick coating. This sometimes resulted in the entire layer peeling off during thermal cycling. With this process, if the coating process was not successful, the panel had to be scrapped, as there was no way to remove the epoxy layer without damaging the face sheet.

Still another method to laminate/bond a film to a substrate involves the use of a pressure sensitive adhesive. While the pressure sensitive adhesive is capable of withstanding the vacuum, it is temperature limited by the softening point or the glass transition temperature ($T_g$) of the adhesive. The glass transition temperature is the temperature below which molecules have very little mobility. When the adhesive is subjected to a solar simulation test, the film attached with pressure sensitive adhesive shows bubbles/blisters when the substrate reaches or exceeds the $T_g$ of the adhesive. The change in morphology caused by the bubbles or the blisters is unacceptable for any lightweight structure requiring a thermally stable coating that does not delaminate, blister, or peel, such as for solar arrays.

Conventional methods to adhere specular or RF reflective coatings to spacecraft structures thus have been found to delaminate, blister, or peel when exposed to the extreme conditions of space, which can reduce the specularity or RF reflectiveness of the coating and undesirably alter the thermal or RF properties of the structure/coating. Accordingly, a need exists for improved methods to bond dissimilar materials.

SUMMARY OF THE INVENTION

In the following description, certain aspects and embodiments of the present invention will become evident. It should be understood that the invention, in its broadest sense, could be practiced without having one or more features of these aspects and embodiments. It should also be understood that these embodiments are merely exemplary.

Disclosed herein is a method of bonding dissimilar materials, said method comprising: providing a first material having a first coefficient of thermal expansion (CTE); providing a second material having a second CTE, wherein the second CTE is substantially different from the first CTE; and fixedly attaching the second material to at least a portion of the first material with an elastic adhesive, such that the second material remains substantially attached to the first material over a predetermined temperature range. The first material may comprise a metal, which may be invar. The second material also may comprise a metal. The first material alternately may comprise a structure. The second material alternately may comprise a coating. In one embodiment, the coating remains substantially attached to said structure when subjected to a space environment.

Alternately, the first material may comprise composite material. Fixedly attaching the second material may comprise: providing an elastic adhesive; placing the elastic adhesive between the second material and at least the portion of the first material; extracting out-gassed materials; and curing at least the adhesive to fixedly attach the second material to the first material. The step of curing may comprise curing the first material, the elastic adhesive, and the second material to fixedly attach the second material to the first material. The elastic adhesive may be provided in one of supported sheet form, unsupported sheet form, paste form, and liquid form. Alternately, the second material may comprise a plurality of solar cells. At least a portion of the first material may be non-conductive. The second material may be RF reflective. The first material may comprise an RF antenna. The second CTE may differ from the first CTE by at least about $50 \times 10^{-7}$ °C.$^{-1}$. The second CTE also may differ from the first CTE by at least about $200 \times 10^{-7}$ °C.$^{-1}$. The second material may remain substantially attached to the first material when the elastic adhesive is at or below its glass transition temperature (Tg). The predetermined temperature range may comprise about $-273.15°$ C. to about $245°$ C. Alternately, the predetermined temperature range may comprise about $-145°$ C. to about $+165°$ C. The second material may remain substantially attached to said first material after at least about 30,000 thermal cycles from about $-145°$ C. to about $+165°$ C. The second material may remain substantially attached to said first material after at least about 55,000 thermal cycles from about $-145°$ C. to about $+165°$ C. The elastic adhesive may have a modulus of elasticity of about 2.76 GPa to about 3.10 GPa. Alternately, the elastic adhesive may have a modulus of elasticity of about 2.97 GPa.

The elastic adhesive may comprise an epoxy film adhesive. The second material may comprise a specular coating. The specular coating may comprise a coated polyimide film. The specular coating may comprise a metallized polyimide film. The polyimide film may comprise Kapton. The specular coating may have a thickness ranging from about 25 microns to about 125 microns. Alternately, the specular coating may have a thickness ranging from about 50 microns to about 75 microns. The specular coating may have a specularity of greater than about 98%. The specular coating may exhibit a maximum thermal optical absorbance of less than about 0.08 and a maximum thermal optical emittance of less than about 0.08. The specular coating may exhibits a maximum thermal optical emittance of less than about 0.02. The extraction of out-gassed material may result in a total mass loss of less than about 1% and a collection of gas phase materials condensation of less than about 0.1%.

Also disclosed herein is a method of applying a coating to a structure, comprising: providing a structure having a first surface and a first CTE; providing an elastic adhesive having a first surface and a second surface; applying the elastic adhesive such that the first surface of the elastic adhesive is proximate at least a portion of the first surface of the structure; providing a coating having a first surface, a second surface, and a second CTE, wherein the second CTE is substantially different from the first CTE; laying up the coating such that the first surface of the coating is proximate at least a portion of the second surface of the elastic adhesive; extracting out-gassed materials from the adhesive, the coating, and the structure; and curing at least the elastic adhesive to fixedly attach the coating to the structure, such that the coating remains substantially attached to the structure over a predetermined temperature range.

The structure further may comprise a second surface and the method further may comprise: providing a second elastic adhesive having a first surface and a second surface; applying the elastic adhesive such that the first surface of the second elastic adhesive is proximate at least a portion of the second surface of the structure; providing a second coating having a first surface, a second surface, and a third CTE, wherein the third CTE is substantially different from the first CTE; laying up the second coating such that the first surface of the second coating is proximate at least a portion of the second surface of the second elastic adhesive; and wherein the step of curing further may comprise curing at least the second adhesive to fixedly attach the second coating to the structure. The second elastic adhesive may be provided in one of supported sheet form, unsupported sheet form, paste form, and liquid form. The coating may remain substantially attached to the structure when subjected to a space environment.

The step of providing a coating further may comprise: providing a mandrel with a first surface having a shape complementary to a shape of at least a portion of the first surface of the structure; forming the coating to the first surface of the mandrel, whereby the coating is maintained substantially wrinkle free during the steps of laying up the coating and curing at least the elastic adhesive. The coating may be formed to the first surface of the mandrel by at least one of stretching the coating and heating the coating. The step of providing a structure further may comprise: providing a mold of at least a portion of the structure; and laying up uncured composite material in said mold, said uncured composite material having a first surface; and wherein applying the elastic adhesive may comprise applying the elastic adhesive such that the first surface of the elastic adhesive is proximate at least a portion of the first surface of the uncured composite material, and curing further may comprise curing at least the composite material and the adhesive to fixedly attach the coating to the structure.

The structure may comprise composite material. The coating may comprise a plurality of solar cells. At least a portion of the first surface of the structure may be non-conductive. The coating may be RF reflective. The structure may comprise an RF antenna. The second CTE may differ from the first CTE by at least about $50 \times 10^{-7}$ °C.$^{-1}$. Alternately, the second CTE may differ from the first CTE by at least about $200 \times 10^{-7}$ °C.$^{-1}$. The coating may remain substantially attached to the structure when the elastic adhesive is at or below its glass transition temperature (Tg). The predetermined temperature range may comprise about −273.15° C. to about 245° C. Alternately, the predetermined temperature range may comprise about −145° C. to about +165° C. The coating may remain substantially attached to said structure after about 30,000 thermal cycles from about −145° C. to about +165° C. The elastic adhesive may have a modulus of elasticity of about 2.76 GPa to about 3.10 GPa. The elastic adhesive may have a modulus of elasticity of about 2.97 GPa. The elastic adhesive may comprise an epoxy film adhesive.

The coating may comprise a specular coating. The specular coating may comprise a coated polyimide film. The specular coating may comprise a metallized polyimide film. The polyimide film may comprise Kapton. The specular coating may have a thickness ranging from about 25 microns to about 125 microns. Alternately, the specular coating may have a thickness ranging from about 50 microns to about 75 microns. The specular coating may have a specularity of greater than about 98%. The specular coating may exhibit a maximum thermal optical absorbance of less than about 0.08 and a maximum thermal optical emittance of less than about 0.08. Alternately, the specular coating may exhibit a maximum thermal optical emittance of less than about 0.02. The extraction of out-gassed material may result in a total mass loss of less than approximately 1% and a collection of gas phase materials condensation of less than approximately 0.1%.

Also disclosed herein is a method of producing an RF device, said method comprising: providing a structure having a first CTE; providing a coating having a second CTE, wherein the second CTE is substantially different from the first CTE; and fixedly attaching the coating to at least a portion of the structure with an elastic adhesive, such that the coating remains substantially attached to the structure and the coating is RF reflective when fixedly attached to the structure. The coating may remain substantially attached to said structure when subjected to a space environment. Fixedly attaching the coating may comprise: providing an elastic adhesive; placing the elastic adhesive between the coating and at least the portion of the structure; extracting out-gassed materials from the adhesive, the coating, and the structure; and curing at least the adhesive to fixedly attach the coating to the structure. The structure may comprise composite material. The structure may be pre-cured. The structure may be co-cured with the adhesive. The RF device may comprise an RF antenna. The second CTE may differ from the first CTE by at least about 50×10$^{-7}$° C.$^{-1}$. Alternately, the second CTE may differ from the first CTE by at least about 200×10$^{-7}$° C.$^{-1}$. The coating may remain substantially attached to the structure when the elastic adhesive is at or below its glass transition temperature (Tg). The coating may remain substantially attached to said structure over a temperature variation from about −273.15° C. to about 245° C. The coating may remain substantially attached to said structure over a temperature variation from about −145° C. to about +165° C. The elastic adhesive may have a modulus of elasticity of about 2.76 GPa to about 3.10 GPa. Alternately, the elastic adhesive may have a modulus of elasticity of about 2.97 GPa.

As used herein, "space environment" means the temperature and pressure environment encountered more than 100 miles above the surface of the earth Aside from the structural and procedural arrangements set forth above, the invention could include a number of other arrangements, such as those explained hereinafter. It is to be understood that both the foregoing description and the following description are exemplary only.

BRIEF DESCRIPTION OF THE DRAWINGS

For a more complete understanding of the invention and some advantages thereof, reference is now made to the following descriptions taken in connection with the accompanying drawings, in which.

DETAILED DESCRIPTION OF THE INVENTION

Reference will now be made in detail to the exemplary embodiments of the invention, examples of which are illustrated in the accompanying drawings.

The subject technology may be applied to a number of applications, including solar reflectors, high frequency satellite communications, RF antennas, and any lightweight structure requiring a thermally stable highly reflective coating. Other potential applications further may include parabolic-shaped satellite concentrator dishes requiring high quality reflective surfaces, inflatable optics and free space optics for high quality coating technology in harsh environments and/or lightweight applications.

The invention addresses problems with the aforementioned techniques for bonding dissimilar materials that will be subjected to large temperature and/or pressure variations, including but not limited to those encountered in the space environment. In one embodiment, the method disclosed herein may create a thermally and mechanically stable bond between dissimilar materials. When subjected to thermal cycling and solar radiation simulations, it may not delaminate, blister, or peel. Neither may it rumple even temporarily under these conditions. It may not crack or damage an underlying structure such as lacquer might during thermal cycling.

Figure 1:
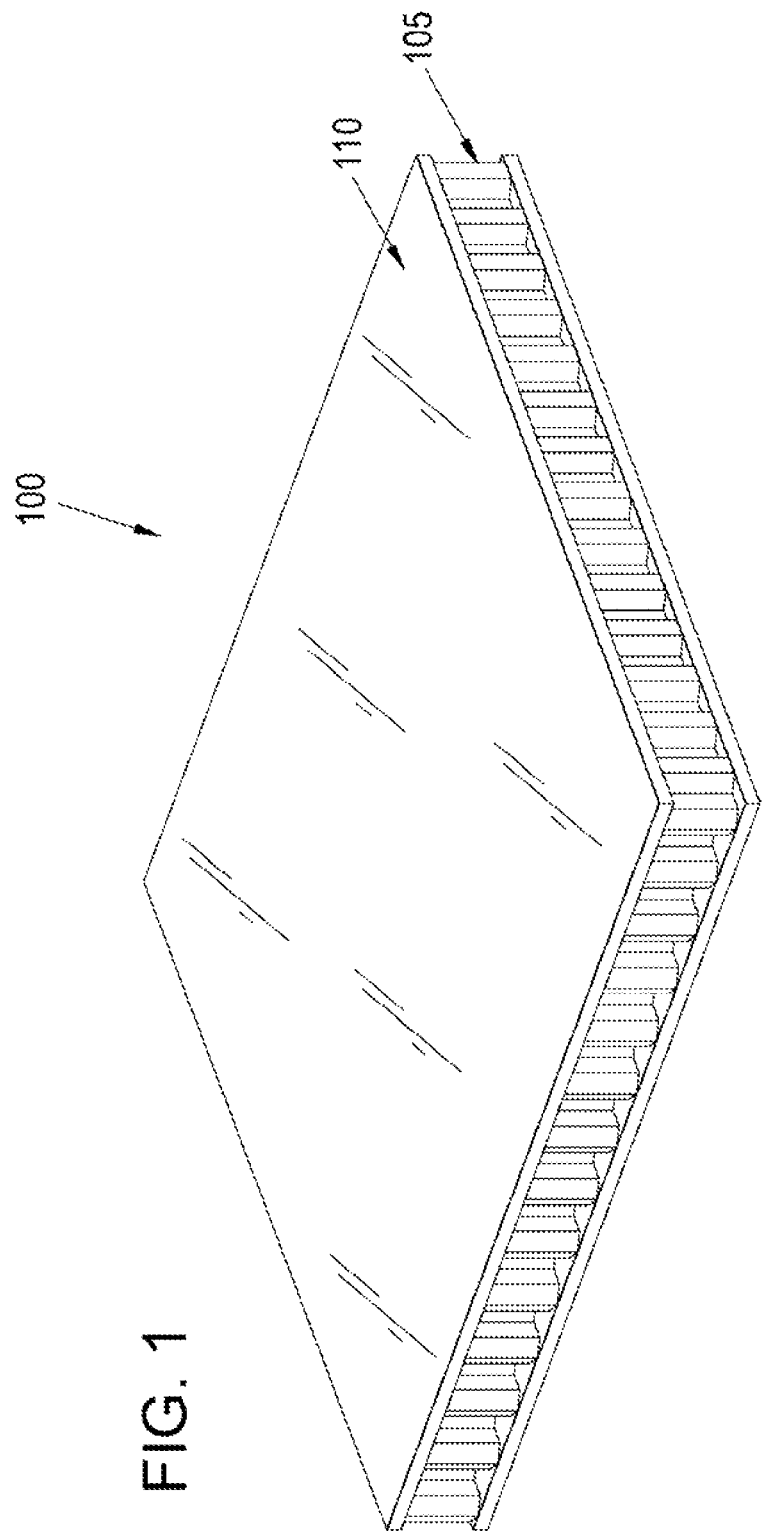
FIG. 1 is a perspective view a structure that may be incorporated into an embodiment of the invention.
Figure 2:
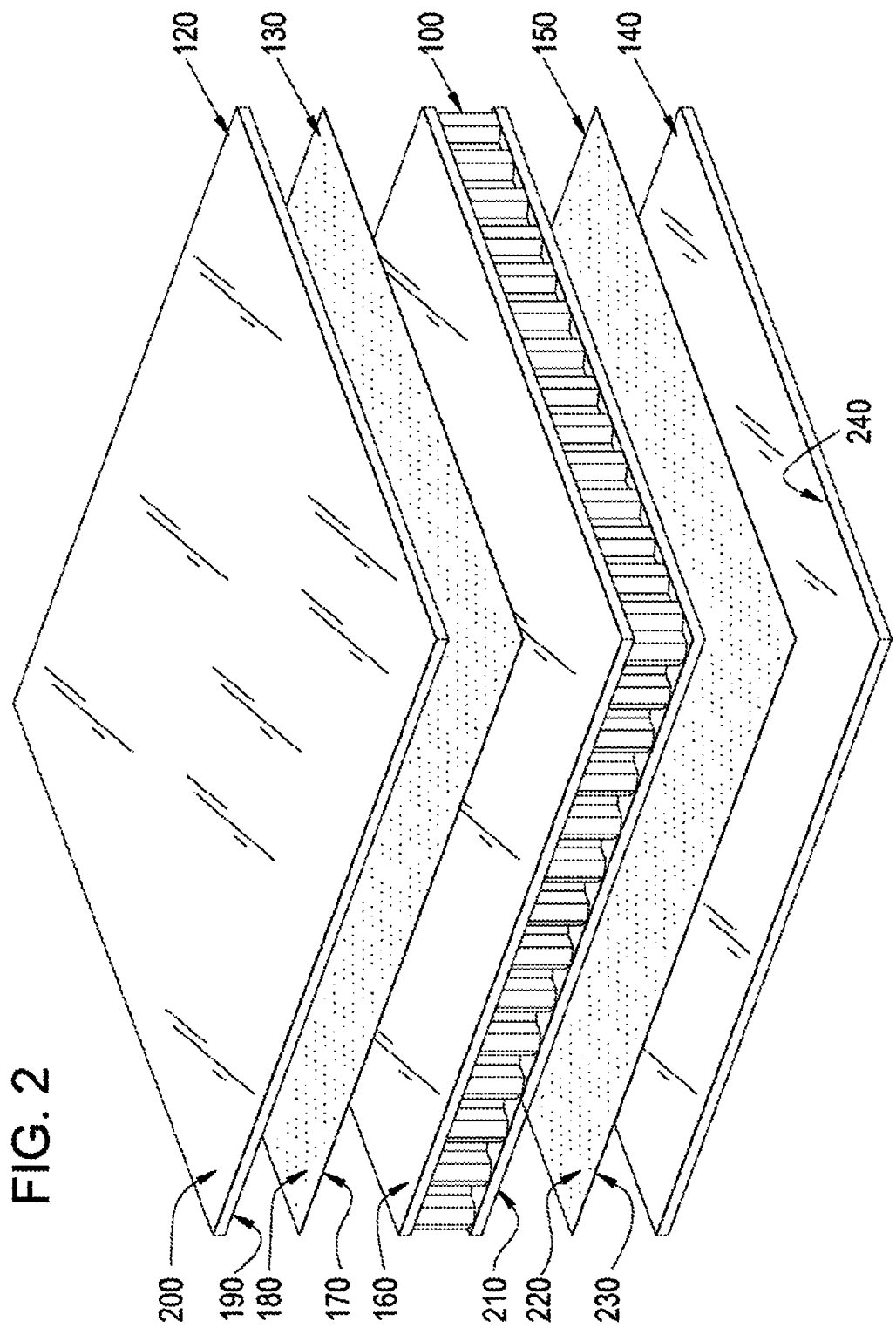
FIG. 2 is an exploded view of dissimilar materials bonded together according to an embodiment of the invention.

In one embodiment, a method is provided for bonding a first material 100 to a second material 120, wherein said first material 100 and said second material 120 have substantially different coefficients of thermal expansion. FIG. 1 displays one variation of a first material 100, which comprises a composite structure with a face sheet 110 cured to a honeycomb substrate 105. One of skill in the art will recognize that in addition to the sandwich construction shown, the disclosed embodiments also enable bonding of dissimilar materials to a first material 100, which may comprise a solid core, a solid core with an outer surface attached, or a variety of other materials or structures known in the art. FIG. 2 displays an exploded version of bonded dissimilar materials bonded together according to an embodiment, displaying first material 100, second material 120 and first elastic adhesive 130, which may be used to fixedly attach first material 100 to second material 120. Elastic adhesive 130 may be used to overcome previous problems associated with large differences in the thermal expansion coefficients of first material 100 and second material 120 and to provide a thermally and chemically stable materials combination that withstands large thermal shock loads (−145° C./+165° C.), such as may be encountered in the space environment. First material 100 and second material 120 may be any two materials with substantially different coefficients of thermal expansion. For example, the CTE of first material 100 may differ from that of second material 120 by at least about 50×10$^{-7}$° C.$^{-1}$. Alternately, the CTE of first material 100 may differ from that of second material 120 by at least about $200 \times 10^{-7}$ °C.$^{-1}$.

In another embodiment, the method may be used to fixedly attach a third material 140 to first material 100 using a second elastic adhesive 150, as shown in FIG. 2. Third material 140 may be the same or similar to second material 120 or may be a different material depending on the thermal, optical, and RF characteristics desired for the particular applications. Similarly, second elastic adhesive 150 may be the same or similar to first elastic adhesive 130, if the CTE differential between first material 100 and third material 140 is the same or similar to the CTE differential between first material 100 and second material 120. Alternately, if the CTE differential between first material 100 and third material 140 differs substantially from the CTE differential between first material 100 and second material 120, a different elastic adhesive with suitable elastic properties may be selected. Differences in the temperature and pressure conditions and variations to which the second and third materials may respectively be subjected may require the use of different first and second elastic adhesives.

For example, the bonded dissimilar materials may be deployed such that second material 120 is subjected to frequent or even constant sunlight causing substantial heating and necessitating a first elastic adhesive with a relatively high glass transition temperature. Alternately, third material 140 may be oriented towards deep space and may remain substantially colder throughout its useful life. In that case second elastic adhesive 150 may be selected to ensure that its modulus of elasticity is such that the first and third materials will remain substantially attached during constant cold temperature operations.

One of the challenges of bonding dissimilar materials for use in the space environment is the wide temperature variation experienced in a single orbit of the earth. For part of the orbit, a spacecraft is exposed to the sun, which can cause substantial heating of materials. For another part of the orbit, the spacecraft may be shaded from direct sunlight by the Earth, which may cause substantial cooling of materials. A thermal control system may be employed to manage temperature variations to allow individual spacecraft components to be maintained within an acceptable range of operating temperatures.

The selection of a suitable elastic adhesive for a particular purpose may be a function of the difference in the CTEs of the first and second materials, and the temperature and pressure variations to which the bonded materials are expected to be subjected during use. As temperature varies, the first and second materials expand and contract at different rates due to the differential in their respective CTEs. This places stress on the adhesive bond between the first and second materials that may tend to cause the materials and adhesive to delaminate, blister, and/or peel from each other, which can adversely effect the structural integrity and thermal characteristics of the bonded materials. Pressure variations or exposure to vacuum conditions similarly may tend to cause the materials and adhesive to delaminate, blister, and/or peel from each other. In one embodiment, an elastic adhesive that is sufficiently elastic to accommodate the temperature and pressure variations expected for the bonded materials without delaminating, blistering, and/or peeling. In one embodiment, the elastic adhesive may have a modulus of elasticity of about 2.76 GPa to about 3.10 GPa. In another embodiment, the elastic adhesive may have a modulus of elasticity of about 2.97 GPa. Another consideration for selection of a suitable adhesive is the glass transition temperature (Tg) of the adhesive. Raising an adhesive above its glass transition temperature can reduce the strength of the adhesive, which can lead to delaminating, blistering, and/or peeling of first material 100 and second material 120 from each other.

In another embodiment, the elasticity of the elastic adhesive may permit second material 120 to remain substantially attached to first material 100 when the temperature of the first adhesive 130 is kept at or below its glass transition temperature (Tg). Alternately, the elastic adhesive may permit second material 120 to remain substantially attached to first material 100 over a temperature range of at least about −145° C. to at least about +165° C. Alternately, the elastic adhesive may permit second material 120 to remain substantially attached to first material 100 over a temperature range of at least about −273.15° C. to at least about +245° C. In another embodiment, second material 120 remains substantially attached to first material 100 after at least about 30,000 thermal cycles from at least about −145° C. to at least about +165° C. In yet another embodiment, second material 120 remains substantially attached to first material 100 after at least about 5,000 thermal cycles from at least about −145° C. to at least about +165° C. In one embodiment, the thermal cycle may be induced by the thermal variation experienced by a body during one orbit of the Earth in the space environment. Alternately, the thermal variations may be the result of any natural or manmade process that induces cyclic temperature variations.

In yet another embodiment, the second material 120 may be a specular coating. The specular coating may be an aluminized polyimide film. The aluminized polyimide film optionally may be Kapton. The specular coating may have a thickness ranging from about 25 microns to about 125 microns. Alternately, the specular coating may have a thickness ranging from about 50 microns to about 75 microns. The specular coating may have a specularity of greater than about 98%. Additionally, the surface properties and surface treatment of said specular coating may be varied so as to alter the specularity of said coating. The specular coating may further exhibit a maximum thermal optical absorbance of at least about 0.08 and a maximum thermal optical emittance of at least about 0.08. Alternately, the specular coating may exhibit a maximum thermal optical emittance of less than about 0.02. The surface properties and surface treatment of said specular coating may optionally be varied so as to maximize the thermal performance of the thermal optical absorbance and emittance of said specular coating for a particular application. In one embodiment, the epoxy film adhesive may be BF 548, and the structure may be a composite.

In yet another embodiment, a method may be used to apply solar cells to a structure such that they do not delaminate, blister, and/or peel from the structure over the expected range of operating temperatures and pressures. In this embodiment, second material 120 may comprise a plurality of solar cells, first material 100 may comprise a non-conductive coating, and third material 140 may comprise a structure. The structure may comprise a composite structure or a conductive or semi conductive substrate. The plurality of solar cells 120 may be secured to the non-conductive coating 100 by elastic adhesive 130. Similarly, the non conductive coating 100 may be secured to structure 140 by second adhesive 150 such that they do not materially move with respect to each other. Outgassed materials may be extracted at least the first and second adhesives during curing by the application of pressure and heat to affix the plurality of solar cells and non-conductive coating to the structure. The non-conductive coating may extend the useful life and/or efficiency of the attached solar cells by preventing the solar cells from shorting to any conductive portion of the structure.

In another embodiment, the coating and adhesive may be applied thinly enough such that they do not impart a significant stress to the structure, providing dimensional stability over a range of temperatures. In another embodiment, the method may produce a chemically stable bond. In another embodiment, the dissimilar materials to be bonded may include a composite carbon fiber face sheet and an aluminized polyimide film. In contrast to applying the aluminum directly on the carbon fiber face sheet, the Kapton layer can provide a barrier between the aluminum and the carbon fibers to preclude galvanic corrosion of the aluminum film. In this embodiment, the process can be easily repeated and can provide a high yield, i.e. it can work every time without there being any bare spots such as those found during the reverse coating process. When subjected to thermal cycling and solar radiation simulation, it may not delaminate, blister, or peel. Neither may it "rumple" even temporarily under these conditions. It may not crack or damage the underlying substrate such as lacquer might during thermal cycling. In yet another embodiment, the subject invention may avoid the blisters and bubbles associated with the use of pressure-sensitive adhesives.

In one embodiment, this innovation can make use of aluminized Kapton film such as is normally used in fabricating thermal blankets for space flight hardware. The smooth finish and aluminum coating of the Kapton film can provide the specularity. The aluminized Kapton may be bonded to the panel facesheets using an elastic structural film adhesive. The thickness of the Kapton film and the film adhesive bonding agent may reduce/eliminate print-through of the morphology of the substrate surface. The film adhesive in sheet form, either supported or unsupported, may be laid on top of the composite substrate. The aluminized film may be laid over the top of the film adhesive and the panel. A tooling plate may be laid on top of this assembly. This complete assembly may be placed in a vacuum bag and evacuated to hold the pieces in place and extract volatiles while the adhesive is cured by the application of pressure and temperature. Thus, the aluminized Kapton film may be bonded to the composite substrate with an elastic adhesive resulting in a specular surface.

In addition to Earth shade panels, this method could also be used on optical grade composite structures. As noted above, the differential thermal expansion between these substrate materials and the specular coatings can be large, particularly when they are used in cryogenic applications or exposed directly to the space environment. The present technique may provide an economic and repeatable process for applying reflective coatings to these optical grade components.

In another embodiment, the material for the coating may be an aluminized polyimide film that is a stock item from DuPont's Kapton product line. The adhesive chosen may be BF 548 from Bryte Technologies, which is quoted for use in secondary aircraft parts, radomes and antennae, and reflectors, among other applications. This adhesive is highly elastic, and may successfully accommodate the CTE difference between the composite and Kapton film. The film adhesive may be chosen because of its stress-free condition, which occurs at a very low temperature, making it suitable for use on the composite panels in space conditions; these panels may be exposed to and suffer from large thermal swings, ranging from approximately −145° C. to approximately +165° C. In one embodiment, the low temperature stress free condition can be maintained by pre-curing the underlying composite structure such that only the adhesive is cured to bond the polyimide film to the composite structure. Alternately, for higher temperature applications, an adhesive with a higher temperature stress-free condition can be selected to minimize stresses in the adhesive during high temperature that may cause the dissimilar materials to delaminate, blister or peel from each other. Optionally, the high temperature stress free condition may be maintained by co-curing the adhesive with the composite structure. During the curing process, the extraction of out-gassed material may result in a total mass loss of less than about 1% and a collection of gas phase materials condensation of less than about 0.1%.

In yet another embodiment, a coating may be applied to a structure by providing a structure 100 having a first surface 160 and a first CTE; providing an elastic adhesive 130 having a first surface 170 and a second surface 180; applying the elastic adhesive such that the first surface of the elastic adhesive is proximate at least a portion of the first surface of the structure; providing a coating 120 having a first surface 190, a second surface 200, and a second CTE, wherein the second CTE is substantially different from the first CTE; laying up the coating such that the first surface of the coating is proximate at least a portion of the second surface of the elastic adhesive; extracting out-gassed materials from the adhesive, the coating, and the structure; and curing at least the elastic adhesive to fixedly attach the coating to the structure, such that the coating remains substantially attached to the structure over a predetermined temperature range.

The structure further may comprise a second surface 210 and a second elastic adhesive 150 having a first surface 220, and a second surface 230 may be applied such that the first surface of the second elastic adhesive is proximate at least a portion of the second surface of the structure. A second coating 140 further may be provided having a first surface 240 and a third CTE, wherein the third CTE is substantially different from the first CTE. The second coating may be laid up such that the first surface of the second coating is proximate at least a portion of the second surface of the second elastic adhesive and at least the second adhesive may be cured to fixedly attach the second coating to the structure. The second elastic adhesive may be provided in one of supported sheet form, unsupported sheet form, paste form, and liquid form. The coating may remain substantially attached to the structure when subjected to a space environment. The first and second elastic adhesives may be cured independently of each other or cured simultaneously. In addition, one or more of the first and second elastic adhesives may be co-cured with the structure. Alternately the structure may be pre-cured prior to the curing of one or both elastic adhesives. Optionally, the second and third CTEs may be substantially similar. Alternately, the second and third CTEs may be substantially different to accommodate different operating profiles for temperature and pressure at the bond between the structure and the first coating and bond between the structure and the second coating.

Figure 3:
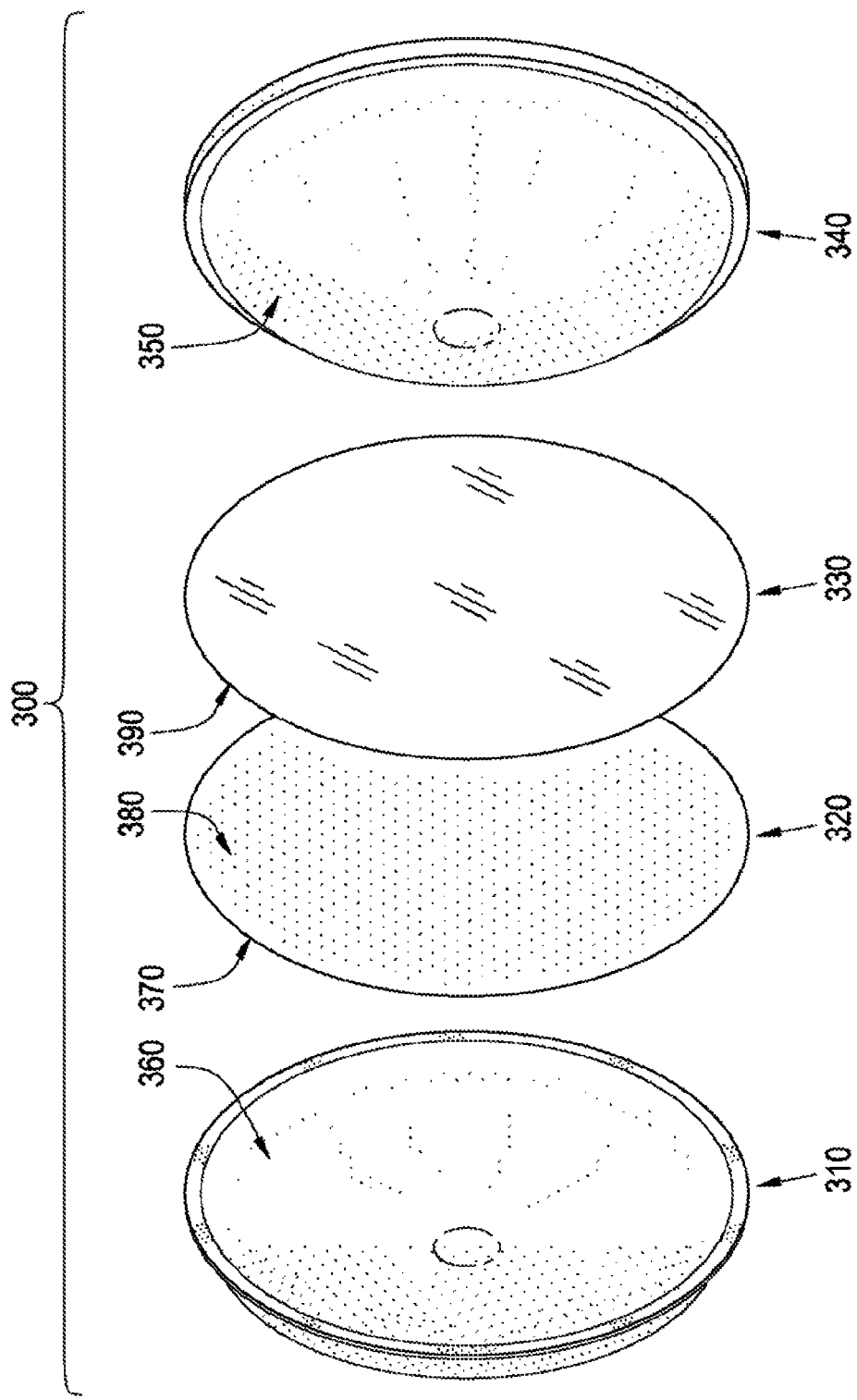
FIG. 3 is an exploded side view of dissimilar materials bonded together according to another embodiment of the invention.

In yet another embodiment as shown in FIG. 3, a first coating 330 may be applied to a structure 310 having a first surface 360 by providing a mandrel 340 with a first surface 350 having a shape complementary to a shape of at least a portion of the first surface 360 of structure 310. The coating may be formed to the first surface of the mandrel to maintain the coating substantially wrinkle free during the steps of laying up the coating and curing at least the elastic adhesive 320. The coating may be formed to the first surface of the mandrel by at least one of stretching the coating and heating the coating. The elastic adhesive 320 may have a first surface 370 and a second surface 380. The coating may be fixedly attached to the structure by applying the elastic adhesive such that the first surface 370 of the elastic adhesive is proximate at least a portion of the first surface 360 of the structure; applying the mandrel 340 and coating 330 such that the first surface 390 of the coating is proximate at least a portion of the second surface 380 of elastic adhesive 320; and curing at least the elastic adhesive to fixedly attach the coating to the structure, such that the coating remains substantially attached to the structure over a predetermined temperature range.

In another embodiment, the structure may be co-cured along with one or both of the first and second adhesives by providing a mold of at least a portion of the structure; and laying up uncured composite material in the mold. In that embodiment the elastic adhesive may be applied such that the first surface of the elastic adhesive is proximate at least a portion of a first surface of the uncured composite material, and the composite material and the adhesive may be co-cured to fixedly attach the coating to the structure.

In another embodiment, the adhesive may be applied between the coating and component to accommodate large differences in CTE. In one test, the replacement panel was coated on the ground under vacuum conditions, using a temperature of 250° F. and a pressure of 15 psi. A custom tool also was used to apply the pressure between the film, adhesive, and panel. The size of panels or surface that could be coated may be scaled up, depending on application or use. This embodiment could permit high specular quality of greater than about 98% of the films attached to panels. The disclosed methods offer improvements over existing methods such as replicating, which is expensive, unreliable, and often more complicated. In addition, the process can use standard materials that are easily available, is well developed and characterized, and can produce films that meet industry standards.

In another embodiment, a new process is used for putting existing materials together in combination to yield properties not previously obtainable. The embodiment may economically provide a high level of thermal and optical performance from coatings on composites. The process can provide low expense, ease of adoption, and repeatability. In one embodiment, sheet form adhesive may be laid on a composite panel, followed by the aluminized Kapton film (which is used extensively as thermal blanketing on space missions). These may then be placed inside a vacuum bag, placed under pressure and evacuated to remove bubbles. Heat may also be applied as needed during the curing process, as will be known to those who are skilled in the art. A commercially available and inexpensive adhesive may be used. A wide range of such adhesives is available to accommodate different operating conditions. In principle, different shapes can also be accommodated. Applications can also include large composite mirrors and lightweight telescopes, and solar concentrators. Another use can be reflectors for either concentrating or spreading light beams. Applications for composite structures fabricated using the subject technology are numerous and may include transportation, industrial, marine, utilities, aerospace, defense, sporting equipment, mining and construction. Those requiring optical quality coatings may include mirrors and reflectors for use in space, and potentially solar concentrators and light reflectors on the ground. RF reflectors used in satellite dishes may represent a large market for a range of applications that strongly depend on the requirements of the reflecting surface. For example, the quality of a surface required can depend on the operating frequency; the higher the frequency, the better the surface reflectivity needs to be. In one embodiment, the disclosed methods could enable applications in high frequency satellite communications, currently operating up to about 36 GHz in the Ku band. In other environments, the disclosed methods could enable applications in RF reflectors for scientific payloads operating up to the Tetra Hertz range of the RF spectrum.

In yet another embodiment, an RF device may be produced by providing a structure having a first CTE; providing a coating having a second CTE substantially different from the first CTE; and fixedly attaching the coating to at least a portion of the structure with an elastic adhesive, such that the coating remains substantially attached to the structure and the coating is RF reflective when fixedly attached to the structure. The coating may remain substantially attached to the structure when subjected to a space environment. The RF reflective coating may be fixedly attached by providing an elastic adhesive; placing the elastic adhesive between the coating and at least the portion of the structure; extracting out-gassed materials from the adhesive, the coating, and the structure; and curing at least the adhesive to fixedly attach the coating to the structure. The structure may comprise composite material. The structure may be pre-cured. The structure may be co-cured with the adhesive. The RF device may comprise an RF antenna.

Sufficient RF reflectivity of the resulting surface, particularly for high frequency applications can be produced by using a mandrel with a first surface having a shape complementary to a shape of at least a portion of a first surface of the structure; forming the coating to the first surface of the mandrel to maintain the coating substantially wrinkle free during the steps of laying up the coating and curing at least the elastic adhesive. The coating may be formed to the first surface of the mandrel by at least one of stretching the coating and heating the coating. In another embodiment, the structure may be co-cured along with the elastic adhesive by providing a mold of at least a portion of the structure; and laying up uncured composite material in the mold. In that embodiment, the elastic adhesive may be applied such that the first surface of the elastic adhesive is proximate at least a portion of a first surface of the uncured composite material, and the composite material and the adhesive may be co-cured to fixedly attach the coating to the structure.

Qualification testing proved the materials and processes used meet stringent structural and thermal requirements. The qualifications consisted of 100 thermal cycles in high vacuum from approximately −145° C. to approximately +165° C., solar simulation in high vacuum from approximately −145° C. to approximately +165° C., flat-wise tension to measure the adhesive strength of the film to the substrate, and outgassing test per ASTM E-595. There was no visual evidence of the Kapton film delaminating, blistering, or peeling after thermal cycling when examined at ambient conditions. Tests using uncoated Kapton film allowed bondline inspections. Intentionally placed flaws were inspected before and after thermal cycling and indicated no growth of flaws. The flat-wise tension test showed a pull to destruct load greater than 600 psi after thermal cycling. Samples subjected to the solar simulation of 3 suns also showed no visual delamination, blistering or peeling when viewed under test conditions. This may be important because aluminized Kapton applied with Y-966 pressure sensitive adhesive also passed thermal cycling tests but rumpled up like an old rug when subjected to a 30 C solar simulation. Samples subjected to outgassing tests per E595 showed total mass loss (TML) less than 1% and collectible volatile condensable material (CVCM) at less than 0.1%. Specularity was measured per GSFC 545-WT-8072.1.32. Thermal optical properties (absorptance (0.08 max) and emittance (0.02 max)) were measured per GSFC545-WI-8072.1.7A.

Other embodiments and uses of the invention will be apparent to those skilled in the art from consideration of the specification and practice of the invention disclosed herein. The specification and examples should be considered exemplary only with the true scope and spirit of the invention indicated by the following claims. As will be easily understood by those of ordinary skill in the art, variations and modifications of each of the disclosed embodiments can be easily made within the scope of this invention as defined by the following claims.

What is claimed is:

1. A method of applying a coating to a structure, comprising:
providing a structure having a first surface and a first coefficient of thermal expansion;
providing an elastic adhesive having a first surface and a second surface;
applying the elastic adhesive such that the first surface of the elastic adhesive is proximate at least a portion of the first surface of the structure;
providing a coating having a first surface, a second surface, and a second coefficient of thermal expansion, wherein the second coefficient of thermal expansion is different from the first coefficient of thermal expansion;
laying up the coating such that the first surface of the coating is proximate at least a portion of the second surface of the elastic adhesive;
extracting out-gassed materials from the adhesive, the coating, and the structure; and
curing at least the elastic adhesive to fixedly attach the coating to the structure, such that the coating remains attached to the structure over a predetermined temperature range; placing a flaw in the adhesive between the first and second surfaces;
qualification testing the structure comprising the steps of repeatedly cycling the structure in a thermal vacuum simulating rigorous space conditions from temperatures between −145 degrees C. to +165 degrees C. and after the cycling placing tension on the structure to measure adhesive strength and after the cycling measuring any change in the previously inserted flaw in the structure.

2. The method of claim 1, wherein the coating comprises a specular coating.

3. The method of claim 2 wherein the specular coating comprises a coated polyimide film.

4. The method of claim 2, wherein said specular coating comprises a metallized polyimide film.

5. The method of claim 2, wherein said specular coating has a thickness ranging from about 25 microns to about 125 microns.

6. The method of claim 5, wherein said specular coating has a thickness ranging from about 50 microns to about 75 microns.

7. The method of claim 2, wherein said specular coating has a specularity of greater than about 98%.

8. The method of claim 2, wherein said specular coating exhibits a maximum thermal optical absorbance of less than about 0.08 and a maximum thermal optical emittance of less than about 0.08.

9. The method of claim 8, wherein said specular coating exhibits a maximum thermal optical emittance of less than about 0.02.

* * * * *